United States Patent
Kishinevsky

(10) Patent No.: US 7,304,438 B2
(45) Date of Patent: Dec. 4, 2007

(54) METHOD AND APPARATUS FOR PREVENTING INSTABILITIES IN RADIO-FREQUENCY PLASMA PROCESSING

(75) Inventor: Michael Kishinevsky, North Andover, MA (US)

(73) Assignee: MKS Instruments, Inc., Wilmington, MA (US)

( * ) Notice: Subject to any disclaimer, the term of this patent is extended or adjusted under 35 U.S.C. 154(b) by 60 days.

(21) Appl. No.: 10/947,397

(22) Filed: Sep. 22, 2004

(65) Prior Publication Data

US 2005/0093459 A1    May 5, 2005

Related U.S. Application Data

(60) Provisional application No. 60/504,698, filed on Sep. 22, 2003.

(51) Int. Cl.
*H05B 41/16* (2006.01)

(52) U.S. Cl. .............. 315/247; 315/246; 315/291; 315/307; 315/224

(58) Field of Classification Search ........... 315/247, 315/246, 291, 307, 224, 225, 209 R
See application file for complete search history.

(56) References Cited

U.S. PATENT DOCUMENTS

| | | | | |
|---|---|---|---|---|
| 4,368,409 A * | 1/1983 | Sivanesan et al. | ......... | 315/411 |
| 4,764,652 A | 8/1988 | Lee | | |
| 5,235,255 A * | 8/1993 | Blom | ......... | 315/224 |
| 5,266,765 A | 11/1993 | Storm et al. | | |
| 5,314,603 A | 5/1994 | Sugiyama et al. | | |
| 5,534,755 A * | 7/1996 | Deavenport et al. | ......... | 315/307 |
| 5,556,549 A | 9/1996 | Patrick et al. | | |
| 5,757,168 A | 5/1998 | DeVale | | |
| 5,982,156 A * | 11/1999 | Weimer et al. | ......... | 323/222 |
| 6,172,466 B1 * | 1/2001 | Ki et al. | ......... | 315/224 |
| 6,208,088 B1 * | 3/2001 | Konishi et al. | ......... | 315/291 |
| 6,300,723 B1 * | 10/2001 | Wang et al. | ......... | 315/247 |
| 6,326,584 B1 | 12/2001 | Jewett et al. | | |
| 6,486,616 B1 * | 11/2002 | Liu et al. | ......... | 315/291 |
| 6,617,808 B2 * | 9/2003 | Ito et al. | ......... | 315/291 |
| 2002/0047641 A1 * | 4/2002 | Ito et al. | ......... | 315/307 |
| 2005/0017655 A1 * | 1/2005 | Seibt et al. | ......... | 315/247 |

FOREIGN PATENT DOCUMENTS

EP    0 568 920    11/1993

OTHER PUBLICATIONS

Scholl, R.A. "Power Systems for Reactive Sputtering of Insulating Films," 2001, 8 pages, http://www.aei.com/tech/whitepapers.asp, printed Sep. 29, 2004.

Scholl, R.A. "Power Supplies for Pulsed Plasma Technologies: State-of-the-Art and Outlook," 1999, 8 pages, http://www.aei.com/tech/whitepapers.asp, printed Sep. 29, 2004.

(Continued)

*Primary Examiner*—Tuyet Vo
(74) *Attorney, Agent, or Firm*—Proskauer Rose LLP

(57) ABSTRACT

A method and apparatus for controlling a power supply to prevent instabilities due to dynamic loads in RF plasma processing systems, operating at frequencies of from 1 MHz and up, uses a feedforward type of control loop to tightly regulate the power supplied to the dynamic electrical load, such as loads caused by variable and inconsistent plasma impedance. A feedback control loop can also be used in combination with the feedforward loop, but at a slower rate, to help regulate the amount of power provided to the load.

57 Claims, 5 Drawing Sheets

OTHER PUBLICATIONS

Hanson, E. et al, "Optimizing Chemical Vapor Deposition Processing Through RF Metrology," 1999, 8 pages, http://www.aei.com/tech/whitepapers.asp, printed Sep. 29, 2004.

Ritchey, Harold C., "Tuner Topics," 1995, 4 pages, http://www.aei.com/tech/whitepapers.asp, printed Sep. 29, 2004.

Scholl, R.A., "A New Method of Handling Arcs and Reducing Particulates in DC Plasma Processing," 1994, 6 pages, http://www.aei.com/tech/whitepapers.asp, printed Sep. 29, 2004.

International Search Report, PCT/US2004/031080, Mar. 18, 2005.

International Search Report for PCT/US2006/042737 (5 pgs.).

* cited by examiner

METHOD AND APPARATUS FOR PREVENTING INSTABILITIES IN RADIO-FREQUENCY PLASMA PROCESSING

RELATED APPLICATIONS

This application claims priority to and benefit of U.S. Provisional Patent Application Ser. No. 60/504,698, filed Sep. 22, 2003, the contents of which are incorporated herein by reference.

FIELD OF THE INVENTION

The invention relates generally to control systems and methods, and more particularly to a method and system for controlling power supplied to a plasma load.

BACKGROUND OF THE INVENTION

Radio frequency or microwave (hereinafter "RF") plasma generation equipment is widely used in semiconductor and industrial plasma processing. Plasma processing supports a wide variety of applications, including etching of materials from substrates, deposition of materials onto substrates, cleaning of substrate surfaces, and modification of substrate surfaces. The frequency and power levels employed vary widely, from about 10 kHz to 10 GHz, and from a few Watts to as much as 100 kW or greater. For semiconductor processing applications, the range of frequencies and powers presently used in plasma processing equipment is somewhat narrower, ranging from about 10 KHz to 2.45 GHz and 10 W to 30 kW, respectively.

Plasma processing equipment typically requires a precision RF signal generator, a matching network, cabling, and metrology equipment. In addition, precision instrumentation is usually required to control the actual power reaching the plasma. The impedance of loads associated with a plasma can vary considerably in response to variations in the gas recipe, various gas supply parameters, plasma density, delivered RF power, pressure and other variables. The dynamic electrical load presented by the varying impedance of a plasma load, and these other variables, can create significant stability control problems for plasma generation equipment.

In today's plasma processing equipment, such as semiconductor tools, it is often observed that the process becomes unstable, exhibiting oscillations in plasma density and/or loss of plasma altogether. Thus, a need exists to prevent these instabilities by changing the way RF power supply is regulated.

A known plasma generation system including a typical plasma processing tool and an RF power supply, familiar to those skilled in the art, is depicted in FIG. 1. An RF power supply 10 delivers RF power through a filter 12 and to the process vacuum chamber 15 via cables 13 and a load matching circuit 14. RF power, both forward and reflected, is measured at output power measurement point 18, near where the power enters the process vacuum chamber 15. Feedback from the output power measurement 18 is sent back to the power supply 10, to complete the control loop.

Power regulation control circuitry is generally designed to operate as fast as possible, to maximize control stability. A typical power supply control loop can operate as fast as a few hundreds of microseconds, and is usually designed and optimized in view of a fixed load, or perhaps with a range of possible fixed loads in mind. The speed of the control loop, e.g., in a plasma generation system, is limited by filter and matching network delays, power measurement time and the internal reaction speed of the power supply. As described above, the plasma introduces additional delays in the control loop that may ultimately result in unstable system behavior. These delays are not easily predictable, are process dependent, and are inconsistent.

However, many power regulation control instabilities can be attributed to having the plasma as a part of the power regulation control loop, since plasma impedance is not constant. More specifically, plasma impedance is a function of the amount of power delivered, the plasma gas pressure, and the chemical composition of the plasma gas mixture. Moreover, the reaction chemistry and gas pressure variables are dependent upon plasma density and temperature, and also have inertia (latent time dependencies) of their own. These inertia times can be in the range of from microseconds to milliseconds, and are determined by various processes, such as diffusion rates, pumping speed, ionization and chemical reaction rates, etc.

Another complicating factor is introduced by the gas supply system 20, which oftentimes has a control loop of its own. This gas supply control loop 22 commonly controls the gas supply to the chamber 15 based on a chamber pressure measurement 23. This separate control loop 22 can extend the specific and system inertia (delay) times of the power control system to hundreds and thousand of milliseconds. Thus, any power supply that uses only a feedback control loop 25 with a response time interval that is faster or comparable to the system or plasma inertia, i.e., the response time of the electrical load (such as the plasma), is potentially prone to instability.

FIG. 2 illustrates the power section of a known power supply technology that can be used with a system such as the plasma processing system illustrated in FIG. 1. A power supply 30 (e.g., a DC switching power supply) is designed to deliver a constant power output value to a load 40 at the output of the power supply. DC power 32, e.g., from a rectified bus or a DC power source, feeds switching transistors and reactive elements such as inductors and capacitors, as is known to those of skill in the art. Power supply 30 generally delivers constant current or constant voltage on a time scale (i.e., at a time interval) faster than the response time of its control loop 33. The control circuit 35 adjusts a control signal to the power supply 30 based on information received from the feedback control loop 33. Of course, power supply 30 can also deliver constant current or power when the control loop is frozen (open). For reference, such power supplies are referred to as "constant current" or "constant voltage" types, below. The control circuit 35 uses feedback 33 from the plasma power measurement circuit 18 to modify the output voltage or current of the power supply 30, to maintain the desired power output. In some situations this can result in stable control of the load 40 (e.g., a plasma load).

In practice, one example of known technology is a "constant current" DC power supply which is used to power an arc-type plasma load. Since plasma resistance drops at higher temperatures (often referred to as "negative resistance"), it is known that supplying a constant current to such a system maintains a stable plasma. In such systems, the power supply functions somewhat as a virtual ballast resistor.

More commonly, many DC switching power supplies use a pulse width modulation ("PWM") control method. These behave as voltage sources and thus are unable to effectively sustain a negative-resistance plasma without a feedback control loop. Moreover, when plasma systems are powered with an RF power supply control problems are exacerbated, since the phase of the reflected power is shifted by cables (e.g., 13) and filters (e.g., 12) to such an extent that it is difficult or impossible to ensure either positive or negative apparent plasma resistance, as viewed from the power supply. Such problems are especially pronounced for systems operating at high frequencies, e.g., in the RF region (i.e., in the range of 1 MHz and up).

SUMMARY OF THE INVENTION

To overcome these problems, what is needed is more than a power supply that merely provides constant voltage or constant current, but instead is capable of delivering essentially constant power to an open loop system, whereby stable operation of the plasma can be maintained regardless of reflection phase and impedance of the plasma.

More specifically, what is needed is a method and apparatus that can be used to precisely control the amount of power provided to a dynamic load, such as a plasma load, in spite of varying load impedance and resistance caused by the plasma and/or other system components.

The present invention overcomes these problems using a power supply that comprises a feedforward loop, and optionally a slow feedback loop that provides a constant power supply to an electrical load, such as a plasma in a plasma generator.

One aspect of the invention features an RF power supply for providing power to a dynamic load, such as a plasma, comprising a power circuit for converting an input power to output RF power. The power circuit has low stored energy, generally on the order of a few microseconds, such that the amount of stored energy in the circuit does not interfere with the control stability. The control circuit provides a control signal to the power circuit to regulate an input power consumption by, e.g., a DC section of a power converter that supplies an RF generator. It also includes a first circuit that provides a measurement of an input power, which is used to adjust the control signal to the power circuit at a first rate. The input power to the RF power supply is thus maintained at a constant, or a substantially constant amount.

Embodiments include a second circuit for measuring an output power at an output of the RF power supply, which is used to compensate the power control signal at a second rate. The first rate is greater than the second rate. The first rate can correspond to a frequency of a switching power supply that feeds DC current to the RF power supply. Furthermore, a weighting factor can be used to cause the first rate to be greater than the second rate. The output of the RF power supply can be used to energize a plasma load.

Embodiments can include at least one of a resonant inverter, a buck-type switching regulator, a boost regulator, a DC switching power supply, and a gate drive circuit of an inverter or a switching power supply. The input power can be measured on a frequency corresponding to each cycle of the switching power supply. The output power signal can be measured at a different rate, e.g., not for each cycle of the switching power supply. In some embodiments the control signal is updated each cycle of the switching power supply, while in others it is not.

The input power measurement can be determined by measuring a total charge that flows through an input terminal of the switching power supply during each cycle. The first rate can adjust the power control signal once per cycle, and the second rate is slower than the first rate and should also be slower than a response time of the electrical load. The second rate can also be slower than a response time of a gas supply system that supplies the electrical load.

Another aspect of the invention features an RF power supply for providing power to a variable-impedance load that includes a control circuit providing a control signal to the RF power supply to regulate a power output level from the RF power supply and a first circuit that provides a measurement of an input power to the RF power supply. The first circuit adjusts the control signal to the RF power supply at a first rate to maintain substantially constant input power. The RF power supply can include a second circuit for measuring an output power at an output of the RF power supply, which is used to compensate the control signal to the RF power supply at a second rate. The first rate should be greater than the second rate. In some embodiments, the input power is constant.

A weighting factor can be used to cause the first rate to be greater than the second rate, and an output of the RF power supply can be used to energize a plasma load. A matching circuit can be used, located between the RF generator and the load (e.g., the plasma load). The power supply can include a resonant inverter, a buck-type switching regulator, a boost regulator, a DC switching power supply, and/or a gate drive circuit of an inverter or switching power supply. The input power can be measured for each cycle of the power supply, and in some embodiments the output power is not measured for each cycle of the power supply. The control signal can be updated for each cycle of the power supply, but in some embodiments it is not.

The RF power supply can deliver power to a plasma load. Further, the control signal can control a pulse width modulation of the power supply, and the amount of pulse width modulation can be determined on a cycle by cycle basis. In some embodiments the first rate adjusts the control signal once per cycle, and the second rate is slower than the first rate and should also be slower than a response time of the electrical load. The second rate can also be slower than a response time of a gas supply system that supplies the electrical load.

Another aspect of the invention features an RF plasma generator comprising a power source and an AC switching power supply. The switching power supply includes a control circuit that provides a control signal to the power supply to regulate a power output level from the power supply and a first circuit that provides a measurement of an input power to the power supply, which is used to adjust the control signal to the power supply at a first rate, thereby maintaining substantially constant input power. It also includes a a second circuit for measuring an output power at an output of the power supply, which is used to compensate the control signal to the power supply at a second rate, such that the first rate is greater than the second rate. An output of the switching power supply supplies an RF generation section. The first rate can correspond to a switching frequency of the switching power supply.

A weighting factor can be used to cause the first rate to be greater than the second rate, and an output of the RF generation section can energize a plasma load. A matching circuit can be used, located between the RF generation section and the load. The RF generator can include a resonant inverter, a buck-type switching regulator, a boost regulator, a DC switching power supply, and/or a gate drive circuit of an inverter or switching power supply. The input power can be measured for each cycle of the power supply, and in some embodiments the output power is not measured for each cycle of the power supply. The control signal can be updated for each cycle of the switching power supply, but in some embodiments it is not.

The input power of the RF generator can be determined by measuring a total charge that flows through an input terminal of the switching power supply during each cycle, and the RF generator can include a plasma generation system. The control signal can a pulse width modulation of the switching power supply and the amount of pulse width modulation can be determined on a cycle by cycle basis. In some embodiments the first rate adjusts the control signal once per cycle, and the second rate is slower than the first rate and should also be slower than a response time of the electrical load. The second rate can also be slower than a response time of a gas supply system that supplies the electrical load.

Yet another aspect of the invention features a method of regulating power to a variable-impedance load, comprising the steps of providing a control circuit that provides a control signal to a switching power supply, to regulate a power output level from an RF generator. The control signal to the switching power supply is adjusted at a first rate based on a first power measured at an input side of the switching power supply. It is also compensated at a second rate, which is based on a second power that is measured at an output side of the RF generator. The first rate is greater (faster) than the second rate. The first rate can correspond to a frequency of the switching power supply.

A weighting factor can be used to cause the first rate to be greater than the second rate, and an output of the RF generator can energize a plasma load. A matching circuit can be used, located between the RF generator and the load. The power supply of the method can include a resonant inverter, a buck-type switching regulator, a boost regulator, a DC switching power supply, and/or a gate drive. The input power can be measured for each cycle of the switching power supply, and in some embodiments the output power is not measured for each cycle of the power supply. The first power can be determined by measuring a total charge that flows through an input terminal of the switching power supply during each cycle. Further, the control signal can be updated for each cycle of the switching power supply, but in some embodiments it is not.

The method can include having an electrical load that comprises a plasma generation system, and the control signal can control a pulse width modulation of the power supply. The amount of pulse width modulation can be determined on a cycle by cycle basis. In some embodiments the first rate adjusts the control signal once per cycle, and the second rate is slower than the first rate and should also be slower than a response time of the electrical load. The second rate can also be slower than a response time of a gas supply system that supplies the electrical load.

BRIEF DESCRIPTION OF THE DRAWINGS

The foregoing discussion will be understood more readily from the following detailed description of the invention, when taken in conjunction with the accompanying drawings, in which.

DETAILED DESCRIPTION

Figure 1:
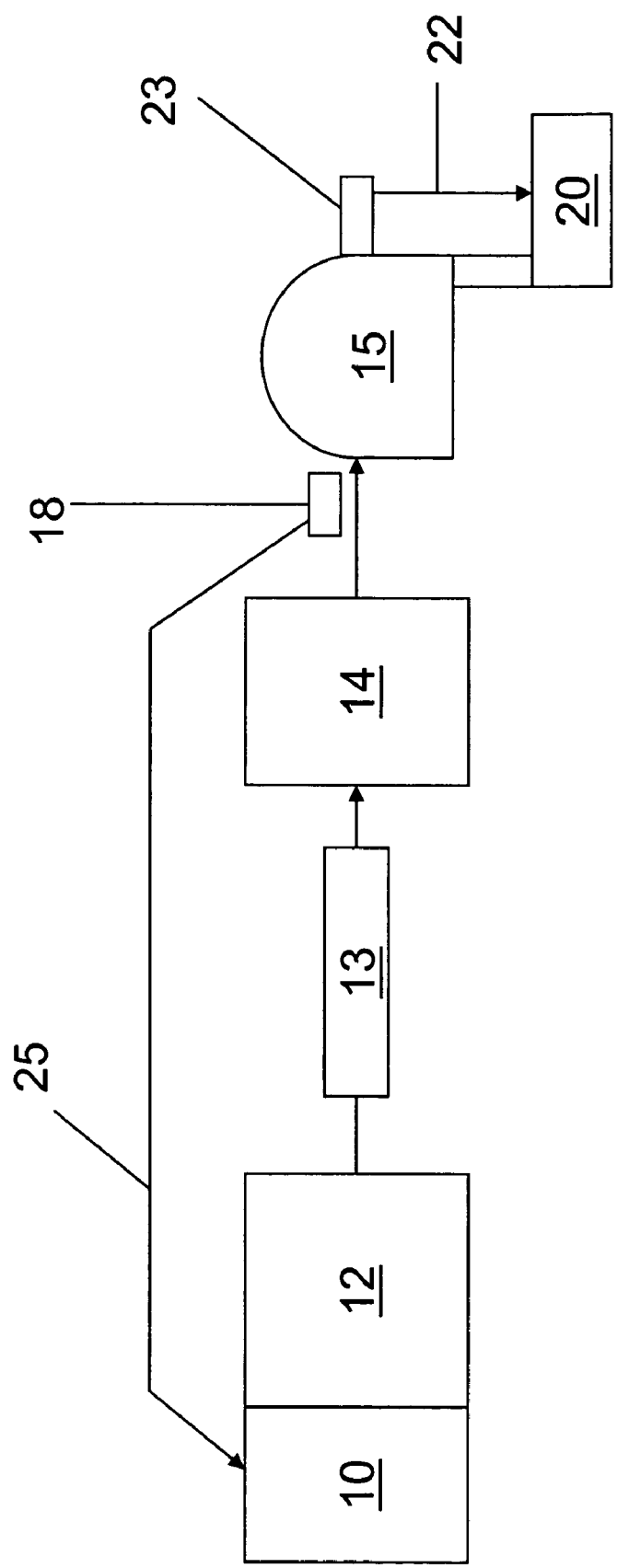
FIG. 1 illustrates a known RF plasma processing tool block diagram.
Figure 2:
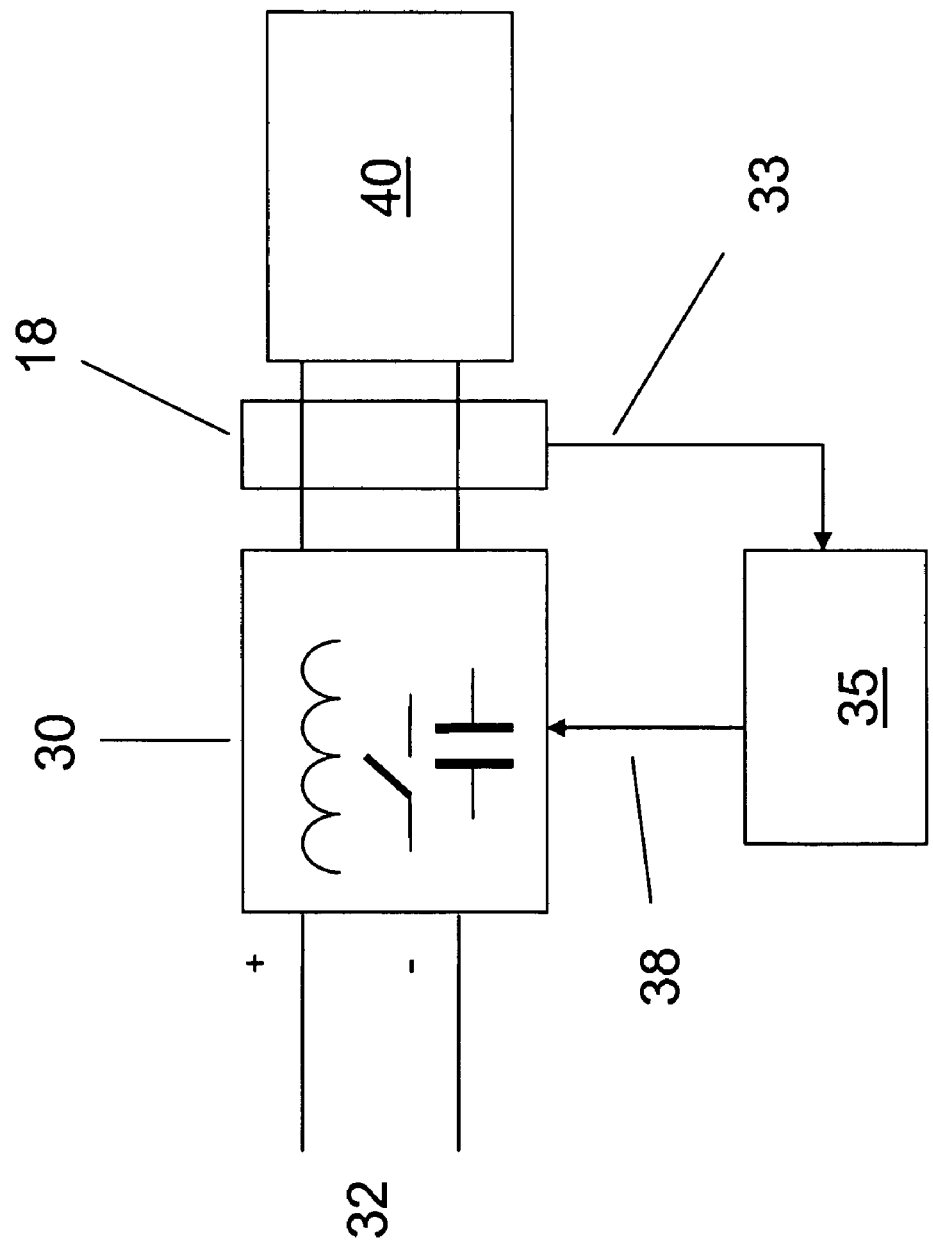
FIG. 2 is an illustration of a known power supply block diagram.
Figure 3:
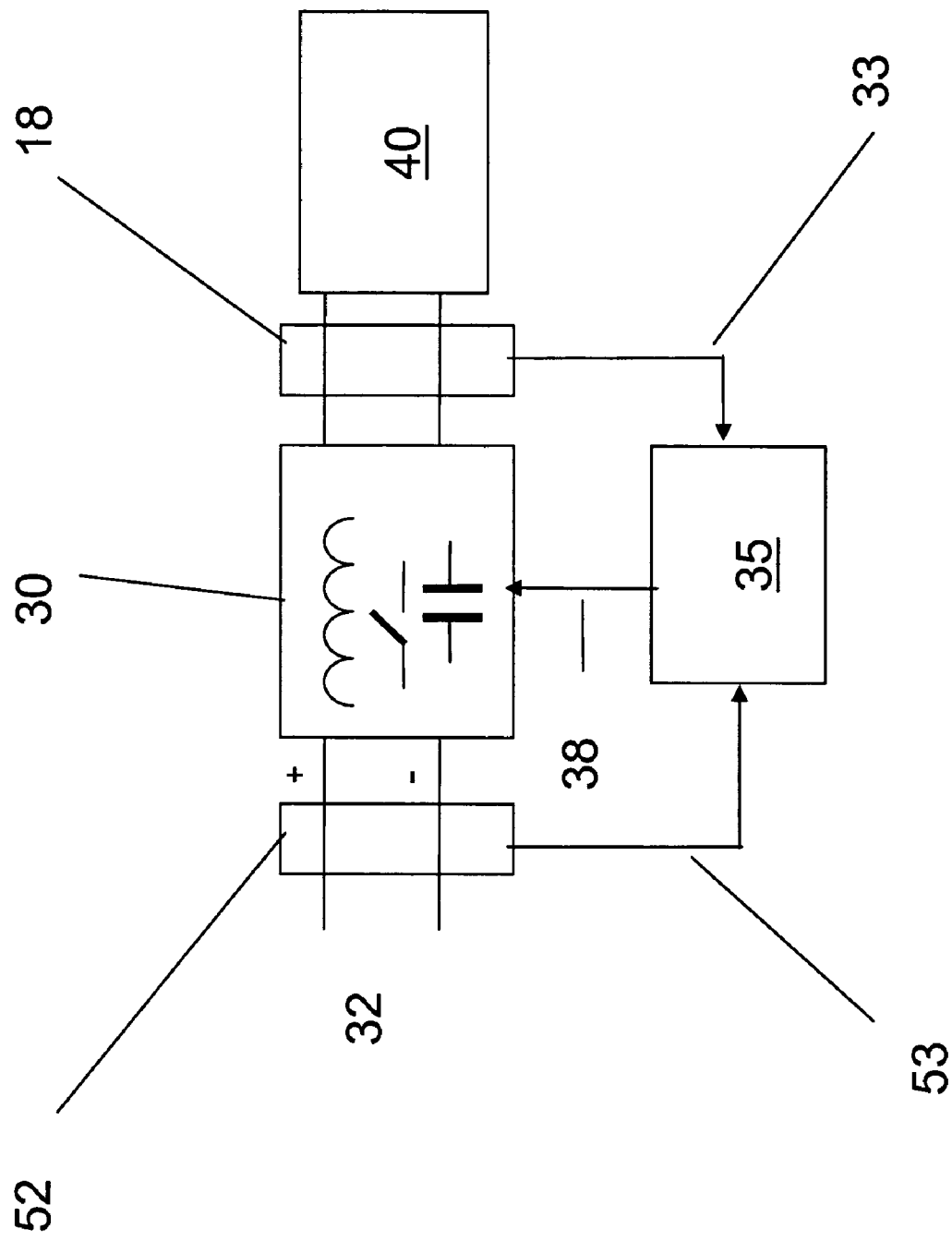
FIG. 3 illustrates a power supply incorporating control features of the invention.

FIG. 3 illustrates an embodiment of the invention that can be used to overcome the problems described above. Providing a constant amount of power to an electrical load, such as a plasma, can result in stable operation of the system. Unfortunately, the feedback-only systems described above do not respond quickly enough to the dynamic operating conditions of plasma generation systems. Even if the response time of feedback loop 33 is faster than the impedance perturbations and other ongoing variations of a dynamic plasma load, such systems do not compensate for varying input signals.

The power supply 30 of FIG. 3 overcomes these problems by controlling input power instead of output power, taking advantage of high efficiency and low stored energy achievable with presently available technologies of switching power supplies. Using this technology, the invention supplies constant power regardless of changes in plasma loading transients, on a time scale basis that is slower than stored energy divided by suppplied power, which can be of the order of several microseconds. To accomplish this the power supply 30 of FIG. 3 uses a fast input measurement 52 on the DC power 30 feeding the power supply 30. This input power measurement 52 feeds a fast feedforward control loop 53 that provides information to the control circuit 35. The control circuit can be an actual circuit (e.g., on a circuit board), an analog controller, any of various digital control systems known to those in the art, or combinations of these. Using this technology, the invention controls the interaction between the power supply and the plasma by tightly controlling the amount of power delivered to the power supply 30. This results in tight control of the power sent to the load because the dynamic plasma parameters are not as sensitive to current or voltage waveforms provided by the power supply, as they are to the amount of power delivered, as averaged over very short time intervals (e.g., a few microseconds).

Accordingly, the invention includes power supply topologies that can deliver almost constant power into a plasma load on very fast time scales, such as time intervals on the order of a few microseconds. In some embodiments, these time intervals can be sufficiently long in duration to approach the dynamic response times of plasma or gas supply responses. However, in all embodiments the power supply output is maintained at a steady amount, in a time scale that is set by the ratio of stored energy to power, regardless of changes in plasma impedance or other load dynamics.

Feedback control 33 alone is not capable of responding fast enough to load and power input changes to accomplish the precise and consistent power output of the invention. Generally, to maintain stability, the feedback control response rate must either be much faster or much slower than all possible plasma responses and gas supply responses. To achieve the precise power output control of the invention, not only must stabilization of the system be provided on a fast time scale, but the control signal 38 of the control circuit 35 can be allowed to only weakly (i.e., slowly) depend upon the output power measurement. Thus, the invention uses only a slow response feedback control loop when compensating the control signal 38 to the power supply. An additional benefit of such a power supply is the easy and stable ignition and build-up of the plasma.

To achieve the results of the invention, a DC power source 32 is connected to the power section of a power supply 30. Preferably, the system is designed to dissipate as little power as possible, and thus incorporates mostly reactive or switching devices. It is desirable to minimize stored energy in the system, thus reducing or virtually eliminating any lag time or time constant of the control system. This design principle is preferred for both DC switching power supplies and lower frequency RF generators incorporating the principles of the invention, which can operate in a switching mode (e.g., Class D or Class F). At higher frequencies, where RF transistors operate in an almost linear regime, this design feature is less important. Nonetheless, it is always preferred to minimize energy losses in the power section of the power supply 30.

In the embodiment shown in FIG. 3, the input power to the power module is measured via input measurement 52. The input power measurement 52 can be located in front of the power supply, but is should be located downstream of any input filter capacitor (not shown). Alternatively, the input power measurement 52 can be located at some point inside the power supply 30, as long as a measurement of input current, voltage, and/or power is provided, as is known to those of skill in the art. The input power measuring means 52 sends this information to the control circuit 35, which then adjusts power control signal 38 to maintain the input power measurement 32 at a substantially constant value. Since the efficiency of the power module is designed to be high, this method of regulation results in nearly constant power output to the load 40.

The power supply 30 can include small amounts of stored energy in output filters and reactive components of the power section, which cannot be changed instantaneously. As discussed above, the design of the system minimizes the amount of energy stored in these components, and thus the amount of energy present in these components is sufficient to power the system for the equivalent of not more than a few microseconds. Having such low stored energy is beneficial to reducing a lag time, or time constant, of the system and is beneficial in maintaining stable plasma control. Since the stored energy amount is small compared with the amount of energy stored in the plasma, it does not have a significant adverse impact on the control of the system and does not cause the plasma to be lost, to become unstable, or to be changed significantly. The RF power thus tracks the input power with very little lag time. As the amount of stored power increases the likelihood of plasma stability control problems also increases.

Embodiments also include a feedback control loop 33. In order to maintain precise power output control to the load 40, the feedback control loop 33 should be tuned such that it has only a slow effect on the control equations of the control circuit 35. The slow response of the feedback control loop 33 ensures that load impedance changes do not destabilize the control loop.

Figure 4:
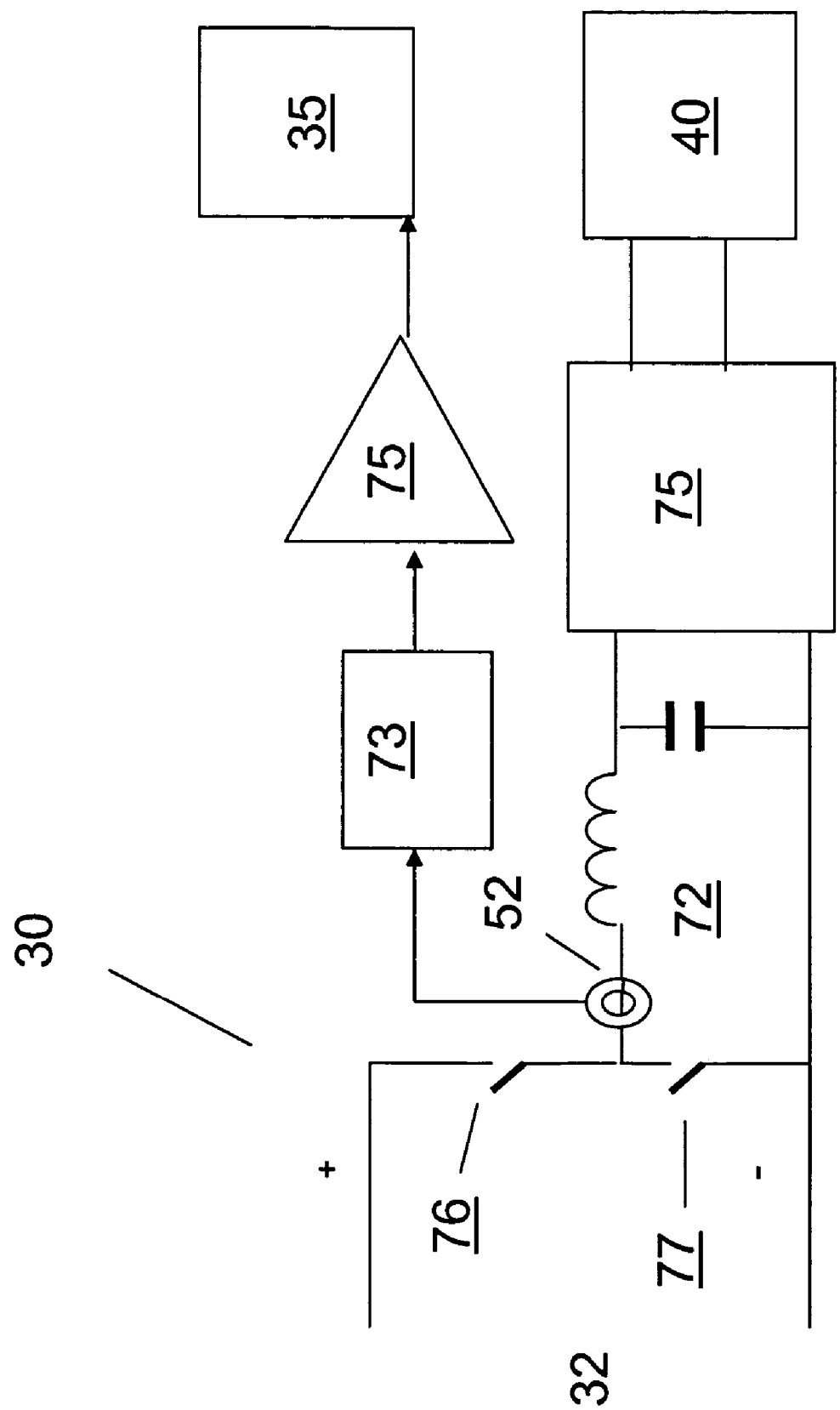
FIG. 4 is an embodiment of the invention including a feed forward buck regulator.

FIG. 4 illustrates a partial view of a power supply representing one embodiment of the invention. A buck-type switching regulator 72 can be used to supply an RF generator 75. The input power to the RF generator is measured using an input measurement 52, an integrator 73, and a comparator 74 which provide an error signal to the control circuit 35. The top switch 76 is an actively driven transistor. The bottom switch 77 can be passive, e.g., a diode, or it can also be a transistor. If the operating frequency of the buck converter 72 is fixed, then the power input is proportional to the amount of charge that passes through the top switch 76 each cycle. Accordingly, a current transducer (e.g., 52) and an integrator 73 can be used to determine the amount of work (energy) provided each cycle. The end of the switching cycle can then be triggered when the amount of work reaches a desired value. During fixed frequency operation, this is indicative of the amount of work provided per unit time, i.e., the amount of power being provided. This measurement can then be conveniently used as a rapid input power measurement 52 to the power supply, upon which the feedforward control loop 53 can be based.

Further, when switching frequency of the DC section is not constant, as is the case in resonant inverter topology, the desired value of integrated charge per period can be determined as a function of both the input voltage and switching frequency in such a way that it can be used to maintain the input power that is entering the power supply 30 via its input terminals at a constant value. Such feed-forward regulation can be performed on a pulse-by-pulse basis, and lags the regulator by only one period (i.e., one cycle of the power supply). The time interval of such a measurement can thus be as short as, e.g., one or two microseconds. One way to compensate for frequency change is to send per-cycle integrated charge information to a comparator, using a ramping reference rather than a constant. The trip point of the comparator is reached when the integrated charge is proportional to the time that has elapsed since the start of the cycle. This technique can be used to maintain constant power on a cycle-by-cycle basis.

Based on the above description, alternative embodiments will become apparent to those of ordinary skill in the art. For example, embodiments include boost regulators, for which constant input power requires that the inductor current be maintained constant. Further, other PWM switching topologies can be used, as well as frequency-controlled topologies such as resonant inverters. These can include an isolation transformer controlled in similar fashion, maintaining constant input power on a pulse-by-pulse basis.

Figure 5:
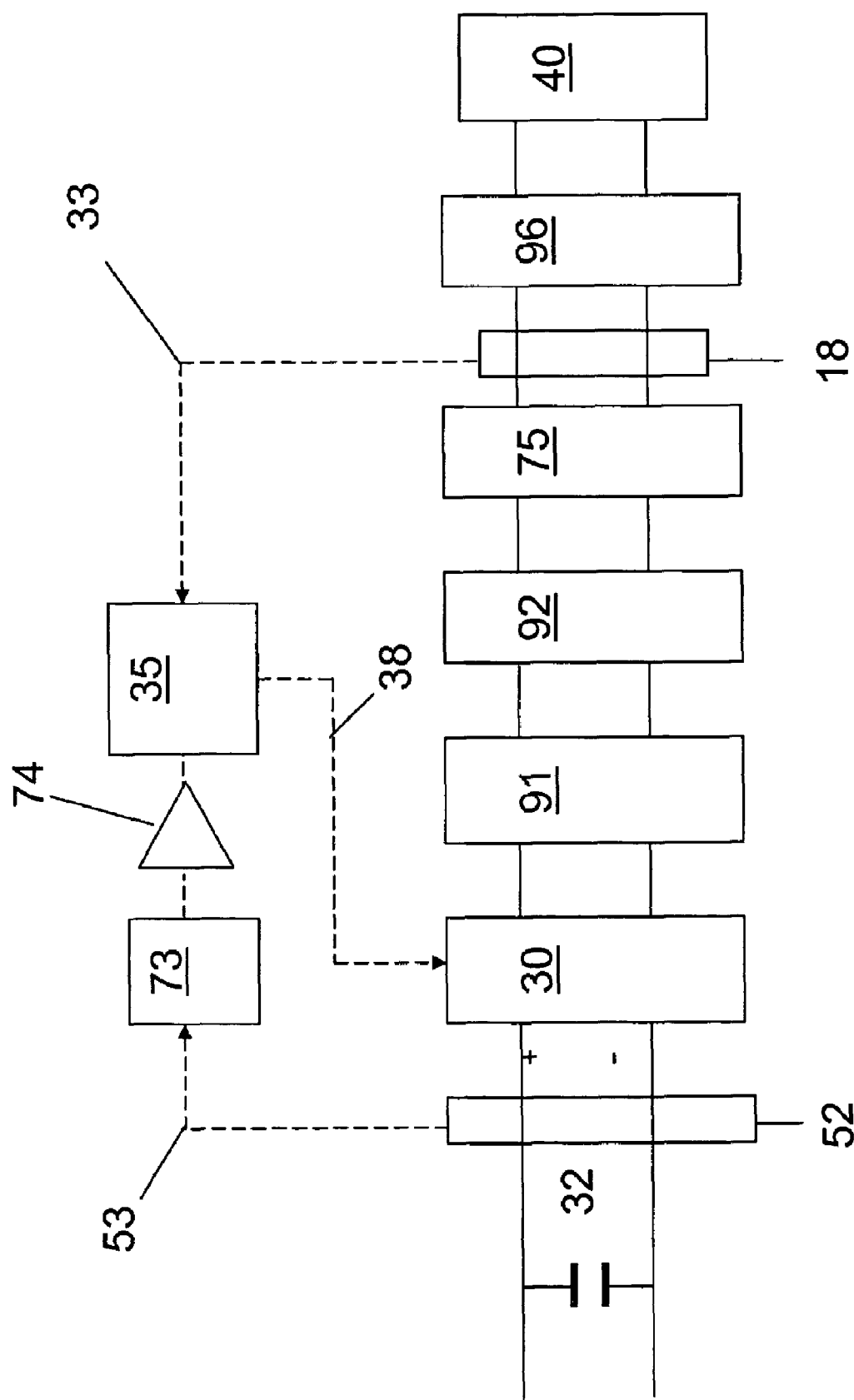
FIG. 5 shows a power supply system that illustrates various features of the invention.

FIG. 5 illustrates a detailed embodiment of the invention, which includes additional detail and optional components. The DC power source 32 provides power to a DC power section 30, such as a DC switching power supply. The input current measurement 52 is illustrated as being located on the input side of the power supply 30, but it can also be located on the output side, e.g., between the power section 30 and the converter 91. As described with respect to FIG. 4, the input measurement signal from 52 can be routed through an integrator 73 and a set point comparator 74.

Embodiments include different comparator 74 functionalities. For example, the input power from input measurement signal 52 can be compared with a power setpoint to determine a calculated feedforward error, and this error can be used by the control circuit 35. This error is used to adjust the control signal 38 to the power supply. In other embodiments, the input signal 52 can be compared, e.g., with an algorithm or a predetermined table of values whereby the output result from the comparator is determined by a predetermined functionality, in accordance with control principles and technologies known to the skilled artisan. This input power regulation can operate very quickly, including as frequently as once per each cycle of the power supply.

The control circuit 35 can also receive a feedback power signal from the output power measurement 18. This feedback signal can be compared with the power output setpoint to determine a calculated feedback error, and this feedback error and the calculated feedforward error can be summed by the control circuit 35 to determine the control signal 38. The power output setpoint for the feedback error calculation can be the same as the power outpoint setpoint for the feedforward error calculation, or it can be different. In either case, weighting of the feedforward and feedback signal can then be performed using various techniques.

Unlike many conventional control systems, the feedforward control loop 53 should be weighted to have more effect on the output signal (e.g., the control signal 38) than the feedback control loop (e.g., feedback control loop 33). This result can be achieved by measurement sampling and then using the results of the sampled feedforward signal more frequently (at a faster rate), e.g., each cycle of the power supply, and using the results of the feedback loop at a second, slower rate such as every cycle, or $10^{th}$, or $100^{th}$ cycle. Using this technique the control signal thus reflects the contribution of the feedforward loop more frequently than the feedback loop, and thus the feedforward measurement is prevalent in the control result 38.

Another technique for favoring the feedforward measurement 52 over the feedback measurement 18 is to sample each loop at the same frequency, but to incorporate a weighting multiplier that increases the feedforward signal or error result, and/or decreases the feedback signal or error result. The error result from the feedback loop could thus always be made to have less effect than the error from the feedforward loop, when determining the control signal 38, even if both loops were sampled at the same frequency. In this manner the weighting factor can cause the rate of the adjusted feedward loop to be greater than the rate of the compensating feedback control loop, even though the feedforward measurement signal 52 and the feedback power output signal are sampled at the same frequency. In some embodiments, the feedback control loop 18 can be weighted to such an extent that it has zero effect on the control signal 38. Other techniques to accomplish the different types of weighting results described above will also become apparent to the skilled artisan, such as averaging, using timed mean values, various sampling techniques, statistical techniques, and others. The result of these methods is that the control circuit 35 outputs a control signal 38 to the power supply based mostly on the input signal, but also on the feedback power signal 18.

The response of the power supply 30 to the control signal 38 is faster than either the feedforward or feedback control loops. The control signal 38 can regulate the power supply 30 using pulse width modulation technologies (for a constant frequency power supply), using frequency modulation, combinations thereof, or using other known DC switching power supply control technologies.

The DC power section 30 generally feeds a converter section 91, such as a buck converter or a resonant converter in combination with a rectifier. Of course, other converter topologies can also be used. Embodiments of the invention include feeding a plasma load from the buck converter without an intermediate RF power generator (described below). Referring again to FIG. 5, output of the converter optionally passes through an output filter 92, and then can be feed to an RF generator 75. The output of the RF generator 75 can pass through the output power measurement device 18 and then to an electrical load 40, such as a plasma in a plasma chamber. Optionally, a matching network 96 can be placed between the RF generator 75 and the load 40.

Although the input measurement 52 is illustrated as being on the supply side of the DC power section 30, it can also be placed in other locations. For example, this feedforward measurement signal can be taken between the power supply 30 and the converter 91, or even further downline, between the converter 91 and the output filter 92 (if an output filter is present).

Similarly, the feedback power measurement 18 can also be located in other positions. For example, the best power measurement reading is obtained when the feedback power measurement device 18 is located directly upstream of the load, i.e., between the matching network (if present) and the load. Due to cost, however, it is often located at the output of the RF generator, i.e., between the RF generator 75 and the matching network 96 (if present). However, embodiments of the invention include having the feedback signal measurement functionally positioned between the output filter 92 (if present) and the RF generator 75, or even between the converter section 91 and the output filter 92. Of course, different combinations of these various input and output signal measurement locations can be used.

Suitable power output measurement techniques can include voltage and/or current measurements, as discussed above with respect to the input measurement 52. However, the output power measurement can also use known techniques and technologies to measure forward and reflected power to accomplish the objectives of the invention.

The techniques of the invention have broader applicability than the embodiment depicted in FIG. 5. Although FIG. 5 depicts the feedforward measurement on the input side of the DC switching power supply 30 and the power output measurement 18 at the output of the RF generator, the invention can be used in other ways. For example, an embodiment includes a feedforward measurement 52 at the inlet of a DC switching power supply 30 and an output power measurement 18 at the outlet of the power supply 30, e.g., after a converter 91. In some applications, the output of the converter can then be routed directly to a load. In other embodiments, the supply to an RF generator does not have to be provided by a DC switching power supply. In such embodiments the input measurement 52 can be taken at the input to the RF generator and the power output measurement 18 can be positioned at the outlet of the RF generator 75. The output of the RF generator can then be fed to a load, e.g., a plasma chamber, either with or without a matching network 96.

Although such embodiments are within the scope of the invention, as noted above, the invention is particularly useful in solving plasma stability problems for systems using high frequency power supplies, and in particular for RF power supplies (i.e., 1 MHz to 10 GHz).

While the invention has been particularly shown and described with reference to specific preferred embodiments, it should be understood by those skilled in the art that various changes in form and detail may be made therein without departing from the spirit and scope of the invention as defined by the appended claims.

I claim:

1. An RF power supply for providing power to a dynamic load, comprising:
    a power circuit for converting an input power to output RF power, the circuit having low stored energy;
    a control circuit providing a control signal to the power circuit to regulate an input power consumption by the RF power supply;
    a first circuit for providing a measurement of an input power to the RF power supply that is used to adjust the control signal to the power circuit at a first rate, such that the input power is substantially constant; and
    a second circuit for measuring an output power at an output of the RF power supply that is used to compensate the power control signal to the RF power supply at a second rate, wherein the first rate is greater than the second rate.

2. The RF power supply of claim 1 wherein the first rate corresponds to a switching frequency of a switching power supply that feeds DC current to the RF power supply.

3. The RF power supply of claim 1 wherein a weighting factor is used to cause the first rate to be greater than the second rate.

4. The RF power supply of claim 1 wherein an output of the RF power supply energizes a plasma load.

5. The RF power supply of claim 1 further comprising at least one of a resonant inverter, a buck-type switching regulator, a boost regulator, a DC switching power supply, and a gate drive circuit of an inverter or switching power supply.

6. The RF power supply of claim 2 wherein the input power is measured for each cycle of the switching power supply.

7. The RF power supply of claim 6 wherein the output power signal is not measured for each cycle of the switching power supply.

8. The RF power supply of claim 5 wherein said control signal is updated for each cycle of the switching power supply.

9. The RF power supply of claim 5 wherein said control signal is not updated for each cycle of the switching power supply.

10. The RF power supply of claim 2, wherein the input power measurement is determined by measuring a total charge that flows through an input terminal of the switching power supply during each cycle.

11. The RF power supply of claim 1, wherein the first rate adjusts the power control signal once per cycle, and the second rate is slower than a response time of the electrical load.

12. The RF power supply of claim 11 wherein the second rate is slower than a response time of a gas supply system that supplies the electrical load.

13. An RF power supply for providing power to a variable-impedance load, comprising:
- a control circuit providing a control signal to the RF power supply to regulate a power output level from the RF power supply;
- a first circuit for providing a measurement of an input power to the RF power supply that is used to adjust the control signal at a first rate to maintain substantially constant input power; and
- a second circuit for measuring an output power at an output of the RF power supply that is used to compensate the power control signal to the RF power supply at a second rate, wherein the first rate is greater than the second rate.

14. The RF power supply of claim 13 wherein the input power is constant.

15. The RF power supply of claim 13 wherein a weighting factor is used to cause the first rate to be greater than the second rate.

16. The RF power supply of claim 13 wherein an output of the RF power supply energizes a plasma load.

17. The RF power supply of claim 13 further comprising a matching circuit between the RF generator and the load.

18. The RF power supply of claim 13 further comprising at least one of a resonant inverter, a buck-type switching regulator, a boost regulator, a DC switching power supply, and a gate drive circuit of an inverter or switching power supply.

19. The RF power supply of claim 13 wherein the input power is measured for each cycle of the power supply.

20. The RF power supply of claim 19 wherein the output power is not measured for each cycle of the power supply.

21. The RF power supply of claim 18 wherein the control signal is updated for each cycle of the power supply.

22. The RF power supply of claim 18 wherein the control signal is not updated for each cycle of the power supply.

23. The RF power supply of claim 13 wherein the electrical load comprises a plasma generation system.

24. The RF power supply of claim 13 wherein the control signal controls a pulse width modulation of the power supply.

25. The RF power supply of claim 24, wherein the amount of pulse width modulation is determined on a cycle by cycle basis.

26. The RF power supply of claim 13, wherein the first rate adjusts the control signal once per cycle, and the second rate is slower than a response time of the electrical load.

27. The RF power supply of claim 26 wherein the second rate is slower than a response time of a gas supply system that supplies the electrical load.

28. An RF plasma generator comprising:
- an power source; and
- an AC switching power supply receiving power from the source comprising:
  - a control circuit providing a control signal to the power supply to regulate a power output level from the power supply;
  - a first circuit for providing a measurement of an input power to the power supply that is used to adjust the control signal to the power supply at a first rate to maintain substantially constant input power; and
  - a second circuit for measuring an output power at an output of the power supply that is used to compensate the control signal to the power supply at a second rate, wherein the first rate is greater than the second rate,
  - wherein an ouput of the switching power supply provides power to an RF generation section.

29. The RF plasma generator of claim 28 wherein the first rate corresponds to a switching frequency of the switching power supply.

30. The RF plasma generator of claim 28 wherein a weighting factor is used to cause the first rate to be greater than the second rate.

31. The RF plasma generator of claim 28 wherein an output of the RF generation section energizes a plasma load.

32. The RF plasma generator of claim 28 further comprising a matching circuit between the RF generation section and the load.

33. The RF plasma generator of claim 28 wherein the switching power supply comprises at least one of a resonant inverter, a buck-type switching regulator, a boost regulator, a DC switching power supply, and a gate drive circuit of an inverter or switching power supply.

34. The RF plasma generator of claim 28 wherein the control signal is updated for each cycle of the switching power supply.

35. The RF plasma generator of claim 34 wherein the control signal is not updated for each cycle of the switching power supply.

36. The RF plasma generator of claim 28 wherein the input power is determined by measuring a total charge that flows through an input terminal of the switching power supply during each cycle.

37. The RF plasma generator of claim 28 wherein the electrical load comprises a plasma generation system.

38. The RF plasma generator of claim 28 wherein the control signal controls a pulse width modulation of the switching power supply.

39. The RF plasma generator of claim 38 wherein the amount of pulse width modulation is determined on a cycle by cycle basis.

40. The RF plasma generator of claim 28 wherein the first rate adjusts the control signal once per cycle, and the second rate is slower than a response time of the electrical load.

41. The RF plasma generator of claim 40 wherein the second rate is slower than a response time of a gas supply system that supplies the electrical load.

42. A method of regulating power to a variable-impedance load, comprising the steps of:
providing a control circuit that provides a control signal to an switching power supply to regulate a power output level from an RF generator;
adjusting the control signal to the switching power supply at a first rate based on a first power measured at an input side of the switching power supply;
compensating the control signal to the switching power supply at a second rate based on a second power measured at an output side of the RF generator, wherein the first rate is greater than the second rate.

43. The method of claim 42 wherein the first rate corresponds to a frequency of the switching power supply.

44. The method of claim 42 wherein a weighting factor is used to cause the first rate to be greater than the second rate.

45. The method of claim 42 wherein an output of the RF generator energizes a plasma load.

46. The method of claim 42 comprising a matching circuit between the RF generator and the load.

47. The method of claim 42 wherein the power supply comprises at least one of a resonant inverter, a buck-type switching regulator, a boost regulator, a DC switching power supply, and a gate drive.

48. The method of claim 42 wherein the input power is measured for each cycle of the switching power supply.

49. The method of claim 48 wherein the output power is not measured for each cycle of the power supply.

50. The method of claim 42 wherein the first power is determined by measuring a total charge that flows through an input terminal of the switching power supply during each cycle.

51. The method of claim 42 wherein the control signal is updated for each cycle of the switching power supply.

52. The method of claim 51 wherein the control signal is not updated for each cycle of the switching power supply.

53. The method of claim 42 wherein the electrical load comprises a plasma generation system.

54. The method of claim 42 wherein the control signal controls a pulse width modulation of the power supply.

55. The method of claim 54 wherein the amount of pulse width modulation is determined on a cycle by cycle basis.

56. The method of claim 42 wherein the first rate adjusts the control signal once per cycle, and the second rate is slower than a response time of the electrical load.

57. The method of claim 56 wherein the second rate is slower than a response time of a gas supply system that supplies the electrical load.

* * * * *